(12) United States Patent
Nakamura

(10) Patent No.: US 8,263,419 B2
(45) Date of Patent: Sep. 11, 2012

(54) SEMICONDUCTOR DEVICE AND METHOD FOR MANUFACTURING THE SAME

(75) Inventor: Ko Nakamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/041,274

(22) Filed: Mar. 3, 2008

(65) Prior Publication Data

US 2008/0149977 A1 Jun. 26, 2008

Related U.S. Application Data

(63) Continuation of application No. PCT/JP2005/015985, filed on Sep. 1, 2005.

(51) Int. Cl.
*H01L 21/00* (2006.01)
(52) U.S. Cl. .................... 438/3; 257/E21.208
(58) Field of Classification Search ...... 438/3; 257/295, 257/E21.208
See application file for complete search history.

(56) References Cited

U.S. PATENT DOCUMENTS

| | | | |
|---|---|---|---|
| 5,776,621 | A | 7/1998 | Nashimoto |
| 6,198,120 | B1 | 3/2001 | Sakurai et al. |
| 7,176,132 | B2 | 2/2007 | Sashida et al. |
| 2004/0166596 | A1 | 8/2004 | Sashida et al. |

FOREIGN PATENT DOCUMENTS

| | | |
|---|---|---|
| EP | 1115148 A1 | 7/2001 |
| JP | 3-262174 A | 11/1991 |
| JP | 6-196648 A | 7/1994 |
| JP | 7-38004 A | 2/1995 |
| JP | 8-335676 A | 12/1996 |
| JP | 9-282943 A | 10/1997 |
| JP | 10-12832 A | 1/1998 |
| JP | 11-297966 A | 10/1999 |
| JP | 2000-58525 A | 2/2000 |
| JP | 2000-109362 A | 4/2000 |
| JP | 2003-324101 A | 11/2003 |
| JP | 2004-153031 A | 5/2004 |
| KR | 2004-38861 A | 5/2004 |

OTHER PUBLICATIONS

International Search Report of PCT/JP2005/015985, date of mailing Dec. 6, 2005.
Office Action issued in corresponding Korean Patent Application No. 10-2008-7004260 issued on Oct. 30, 2009 (with partial translation).
Japanese Office Action dated May 17, 2011, issued in corresponding Japanese Patent Application No. 2007-534187.

Primary Examiner — William D Coleman
(74) Attorney, Agent, or Firm — Westerman, Hattori, Daniels & Adrian, LLP

(57) ABSTRACT

According to the present invention, there is provided a method for manufacturing a semiconductor device, including the steps of forming an insulating film on a silicon substrate, forming a first conductive film on the insulating film, forming an aluminum crystal layer on the first conductive film, forming a ferroelectric film containing $Pb(Zr_xTi_{1-x})O_3$ (where $0 \leq x \leq 1$) on the aluminum crystal layer, forming a second conductive film on the ferroelectric film, and patterning the first conductive film, the ferroelectric film, and the second conductive film to form a capacitor including a lower electrode, a capacitor dielectric film, and an upper electrode which are laminated sequentially.

12 Claims, 15 Drawing Sheets

SEMICONDUCTOR DEVICE AND METHOD FOR MANUFACTURING THE SAME

CROSS-REFERENCE TO RELATED APPLICATIONS

This application is a continuation of prior International Patent Application No. PCT/JP2005/015985 filed Sep. 1, 2005, the entire contents of which are incorporated herein by reference.

TECHNICAL FIELD

It is related to a semiconductor device and a method for manufacturing the semiconductor device.

BACKGROUND

Flash memories and ferroelectric memories are known as non-volatile memories capable of retaining stored information even after the power is turned off.

Among these, flash memory has a floating gate embedded in a gate insulating film of an insulated-gate field-effect transistor (IGFET) to store information by accumulating, in this floating gate, electric charges indicating information. However, for such a flash memory, a tunnel current needs to be applied to the gate insulating film at the time of writing or deleting information. Thus, the flash memory is disadvantageous in that a relatively high voltage is needed.

In contrast, the ferroelectric memory, which is also referred to as FeRAMs (Ferroelectric Random Access Memories), store information by utilizing hysteresis characteristics of a ferroelectric film formed in a ferroelectric capacitor. The ferroelectric film is polarized in accordance with a voltage applied between the upper and lower electrodes of the capacitor, and spontaneous polarization remains even after the voltage is turned off. When polarity of an applied voltage is reversed, the spontaneous polarization is also reversed. Directions of the spontaneous polarization are associated with "1" and "0", so that information is written in the ferroelectric film. Thus, FeRAMs are advantageous in that a voltage required for this writing is lower than that required in the case of flash memories, and that writing can be carried out at a higher speed than that in the case of flash memories.

FIG. 1 is a cross-sectional view of a capacitor Q of the FeRAM.

As shown in the figure, the capacitor Q is formed by stacking lower electrode 101, a capacitor dielectric film 102, and an upper electrode 103 in this order on an underlying film 100.

Among these, for the capacitor dielectric film 102, a PZT ($Pb(Zr_x, Ti_{1-x})O_3$) film is generally used. The ferroelectric characteristics, such as residual polarization charges, of the PZT film greatly depend on an orientation of PZT crystals. When the orientation of the PZT is aligned in (111) direction, its ferroelectric characteristic can be enhanced.

On the other hand, a stacked film including a titanium (Ti) film and a platinum (Pt) film formed in this order is used for the lower electrode 101. In this stacked film, titanium in the titanium film diffuses along the grain boundary of the platinum film, and then reaches a surface of the platinum film. When the PZT film is formed on the stacked film by a sputtering method, the titanium is oxidized by a small amount of oxygen contained in the PZT to form a titanium oxide ($TiO_2$) nucleus. This titanium oxide serves as an initial growth nucleus of the PZT film, so that the orientation of the PZT film is aligned in the (111) direction.

Note that, the titanium oxide nucleus can also be formed when the PZT film is crystallized by an anneal in an oxygen atmosphere.

In addition, since the lattice mismatch of Pt (111) and PZT (111) is small, a PZT film with reduced defects due to the lattice mismatch can be formed on the platinum film.

The capacitor dielectric film 102 used in such a capacitor Q is required to have high-density crystals so that high ferroelectricity can be obtained even when the capacitor Q is miniaturized. Thus, in order to meet this requirement, a MOCVD (metal organic CVD) method is preferably employed as a method for forming the capacitor dielectric film 102, instead of a sol-gel method or a sputtering method.

However, if the PZT film is formed by the MOCVD method, lead (Pb) in the PZT film reacts with platinum in the lower electrode 101, and thereby surface roughness in the lower electrode 101 is caused. This surface roughness makes it difficult to align the orientation of the PZT film in the (111) direction.

In another method, an oxide, such as an iridium oxide ($IrO_x$) film, is formed as the lower electrode 101, so that the PZT film is oriented in the (111) direction by the effect of the orientation of the oxide. However, when a PZT film is formed by the MOCVD method on the lower electrode 101 made of an oxide, the oxide is reduced by PZT, which results in causing the lower electrode 101 to be amorphous. This makes impossible to control the orientation of the PZT film by using the orientation of the lower electrode 101.

Accordingly, when the PZT film is formed by the MOCVD method, an iridium (Ir) film is often formed as the lower electrode 101. In this case, in order to form titanium oxide which is to be an initial growth nucleus of the PZT on the lower electrode 101, a titanium film may be formed under the iridium film to cause titanium to be diffused to the upper surface of the iridium film along the grain boundary of iridium.

However, since the iridium film has grains which are smaller and denser than those of the platinum film, the diffusion of titanium along the grain boundary of iridium cannot be expected, and thus the above-described initial growth nucleus is not generated. Hence, if a stacked film of an iridium film and a titanium film is used for the lower electrode 101, it is difficult to cause PZT to be oriented in the (111) direction by utilizing the initial growth nucleus of titanium oxide.

Moreover, the lattice constant of Ir (111) is smaller than that of PZT (111), so that the lattice mismatch of the iridium film and the PZT film is large. As a result, the PZT film formed on the iridium film is oriented in a direction different from a polarity direction (111), or is randomly oriented.

In the above description, the case of using titanium oxide as the initial growth nucleus of PZT has been described. In the Patent document 1 below, however, $PbTiO_3$ is used as the initial growth nucleus.

However, since $PbTiO_3$ is a ternary compound, it is difficult to control its composition ratio.

Patent document 2 discloses that a titanium oxide film is formed on an iridium film to be a lower electrode, and then the titanium oxide film is used as a nucleus to form a PZT film.

However, titanium oxide, such as $TiO_2$, can be in various bonding states depending on an oxidizing temperature or atmosphere. Thus, it is difficult to control the orientation of titanium oxide.

In this manner, it has been extremely difficult to form, on an iridium film, a PZT film with an orientation aligned in the (111) direction.

In addition to the above-described techniques, Patent documents 3 and 4 also disclose techniques relating to the present application.

Patent document 1: Japanese Patent Laid Open 2000-58525
Patent document 2: Japanese Patent Laid Open Hei 10-12832
Patent document 3: Japanese Patent Laid Open Hei 9-282943
Patent document 4: Japanese Patent Laid Open Hei 11-297966

SUMMARY

It is an aspect of the embodiments discussed herein to provide a method for manufacturing a semiconductor device, including, forming an insulating film over a semiconductor substrate, forming a first conductive film over the insulating film, forming an aluminum crystal layer on the first conductive film, forming a ferroelectric film containing $Pb(Zr_xTi_{1-x})O_3$ (where $0 \leq x \leq 1$) on the aluminum crystal layer, forming a second conductive film on the ferroelectric film, and patterning the first conductive film, the ferroelectric film, and the second conductive film to form a capacitor including a lower electrode, a capacitor dielectric film, an upper electrode which are sequentially stacked.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENT

Figure 1:
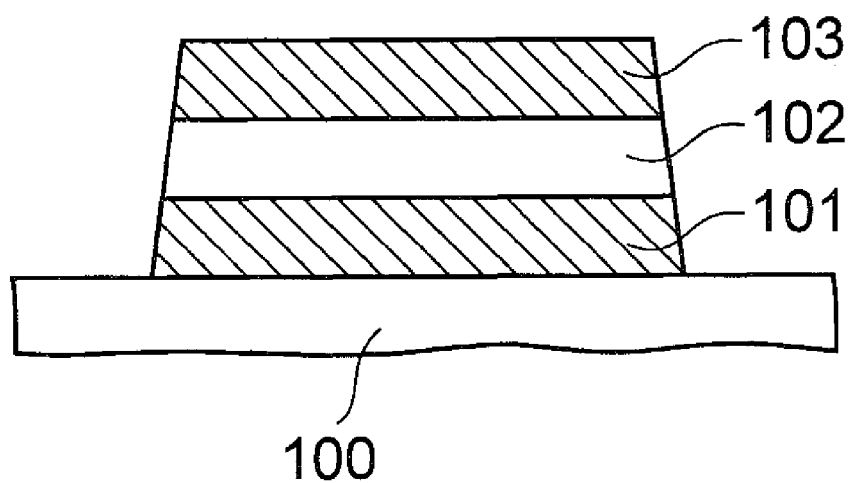
FIG. 1 is a cross-sectional view of a capacitor provided in a semiconductor device according to a conventional technology.

Embodiments will be described in detail by referring to the accompanying drawings.

(1) First Embodiment

FIGS. 2A to 2L are cross-sectional views showing processes of manufacturing a semiconductor device according to a first embodiment.

Firstly, processes for obtaining a cross-sectional structure shown in FIG. 2A will be described.

A groove for STI (shallow trench isolation) for defining an active region of a transistor is formed in a surface of a n-type or p-type silicon (semiconductor) substrate 1. An insulating film, such as silicon oxide, is embedded in the groove to form a device isolation insulating film 3. Note that a device isolation structure is not limited to STI, and the device isolation insulating film 3 may be formed by a LOCOS (local oxidation of silicon) method.

Subsequently, p-type impurities are introduced into the active region of the silicon substrate 1 to form a p-well 2. Thereafter, a surface of the active region is thermally oxidized to form a thermal oxidation film serving as a gate insulating film 4.

After that, an amorphous or polycrystal silicon film and a tungsten silicide film are sequentially formed on the entire upper surface of the silicon substrate 1. These films are patterned by photolithography to form two gate electrodes 5.

The above-described two gate electrodes 5 are arranged on the p-well 2 so as to be substantially parallel each other with a space therebetween, and these gate electrodes 5 constitute part of a ward line.

Then, n-type impurities are introduced into portions of the silicon substrate 1 next to the gate electrodes 5 by ion implantation using the gate electrodes 5 as a mask. Thereby, first and second source/drain extensions 6a and 6b are formed.

Thereafter, an insulating film is formed on the entire upper surface of the silicon substrate 1, and the insulating film is etched back to be left beside the gate electrodes 5 as insulating sidewalls 7. As the insulating film, a silicon oxide film is formed by the CVD method, for example.

Subsequently, while the insulating sidewalls 7 and the gate electrodes 5 are used as a mask, n-type impurities are ion-implanted into the silicon substrate 1 again, so that first and second source/drain regions 8a and 8b are formed beside the two gate electrodes 5 at a distance from each other.

By the processes so far, first and second MOS transistors $TR_1$ and $TR_2$, each of which is constructed from the gate insulating film 4, the gate electrode 5, and first and second source/drain regions 8a and 8b, are formed in the active region of the silicon substrate 1.

Next, after a refractory metal layer, such as a cobalt layer, is formed on the entire upper surface of the silicon substrate 1 by the sputtering method, this refractory metal layer is caused to react with silicon by heat. Thereby, a refractory metal silicide film 9 is formed on the silicon substrate 1. The refractory metal silicide layer 9 is also formed on surface portions of the gate electrodes 5, so that the resistance of gate electrodes 5 is lowered.

After that, the refractory metal layer which is left unreacted on the device isolation insulating film 3 and the like is removed by wet etching.

Subsequently, a silicon oxynitride (SiON) film is formed with a thickness of approximately 200 nm on the entire upper surface of the silicon substrate 1. The silicon oxynitride film thus formed is used as a cover insulating film 11. After that, a silicon oxide film as a first insulating film 12 is formed with a thickness of approximately 1.0 μm on the cover insulating film 11 by the plasma CVD method using a TEOS gas.

Thereafter, the first insulating film 12 is annealed in a nitrogen atmosphere under an atmospheric pressure at the substrate temperature of 700° C. for 30 minutes, so that the first insulating film 12 is made dense. Then, the upper surface of the first insulating film 12 is polished and planarized by the CMP (chemical mechanical polishing) method.

After that, the cover insulating film 11 and the first insulating film 12 are patterned by photolithography to form contact holes on the first and second source/drain regions 8a and 8b. Then, a conductive film is formed on the inner surfaces of the contact holes and the upper surface of the first insulating film. The conductive film is then polished by the CMP method to be left in the contact holes as first and second conductive plugs 10a and 10b. The conductive film is a stacked film of, for example, a glue film formed by the sputtering method and a tungsten film formed by the CVD method. In addition, a film in which a titanium film with a thickness of approximately 20 nm and a titanium nitride film with a thickness of approximately 50 nm are stacked in this order is used for the glue film.

Note that, of the above-described plugs 10a and 10b, the second conductive plug 10b constitutes a part of a bit line together with the second source/drain region 8b formed thereunder.

Figure 2A:
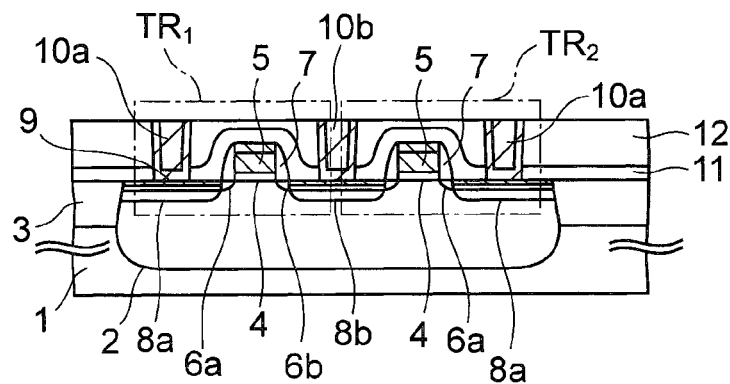
FIGS. 2A to 2L are cross-sectional views showing processes of manufacturing a semiconductor device according to a first embodiment.
Figure 2B:
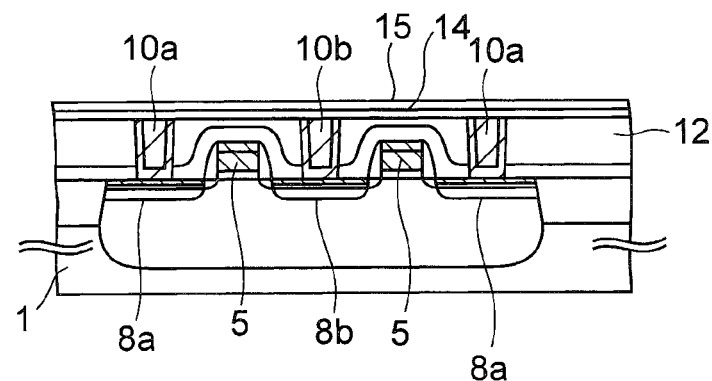

Next, as shown in FIG. 2B, a silicon oxynitride film as an oxidation preventive insulating film 14 is formed by the CVD method with a thickness of approximately 100 nm on each of the upper surfaces of the conductive plugs 10a and 10b and the first insulating film 12. The second conductive plug 10b is mainly formed of tungsten, which can easily be oxidized by oxygen. However, by covering the upper surface thereof with the oxidation preventive insulating film 14 in this manner, contact defect due to oxidation of the second conductive plug 10b is prevented even when the plug 10b is annealed in an oxygen atmosphere.

Then, a silicon oxide film is formed with a thickness of approximately 100 nm on the oxidation preventive insulating film 14 by the CVD method using the TEOS gas, and is used as an insulating adhesive film 15. The insulating adhesive film 15 plays a role to improve adhesiveness with the lower electrode of a capacitor to be described later.

Figure 2C:
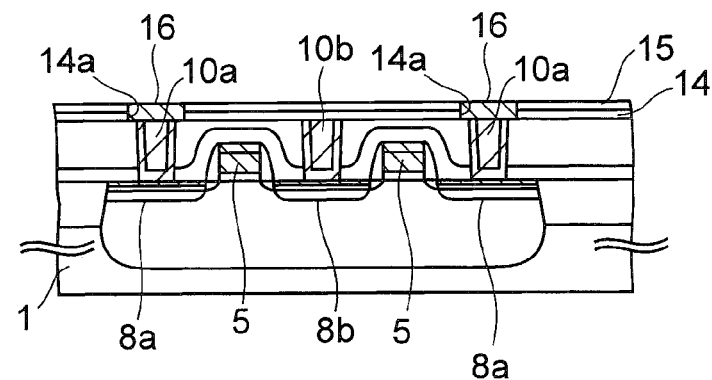

Next, processes for obtaining a cross-sectional structure show in FIG. 2C will be descried.

Firstly, the oxidation preventive insulating film 14 and the insulating adhesive film 15 are patterned by photolithography to form openings 14a in these films.

Then, an iridium film is formed with a thickness to completely embed the openings 14a, a thickness of 400 nm for example, is formed on the insulating adhesive film 15 and in the openings 14a by the sputtering method, and is used as an oxygen barrier metal film 16. After that, the excessive oxygen barrier metal film 16 on the insulating adhesive film 15 is polished and removed by the CMP, and the oxygen barrier metal film 16 is left only in each of the openings 14a in an island shape.

The oxygen barrier metal 16 made of iridium is excellent in preventing oxygen permeability, and thus the first conductive plugs 10a under the oxygen barrier metal 16 are hardly oxidized even if annealing is carried out in the oxygen atmosphere.

Figure 2D:
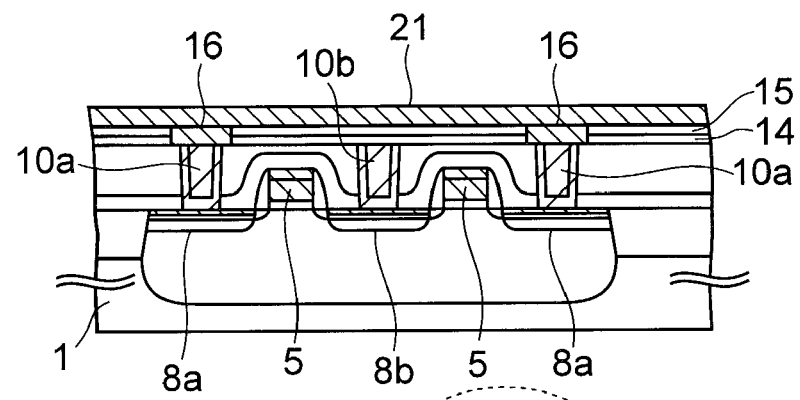

Next, as shown in FIG. 2D, an iridium film is formed with a thickness of approximately 150 nm by the DC sputtering method on each of the insulating adhesive film 15 and the oxygen barrier metal film 16, and is used as a first conductive film 21. Film-forming conditions for this DC sputtering method are not particularly limited. In the present embodiment, power applied to an iridium target is set to be 0.3 kW, and a flow rate of an argon gas as a sputtering gas is set to 199 sccm. In addition, a substrate temperature at the time of forming the first conductive film 21 is 550° C., and a film-forming time is 350 seconds.

Figure 2E:
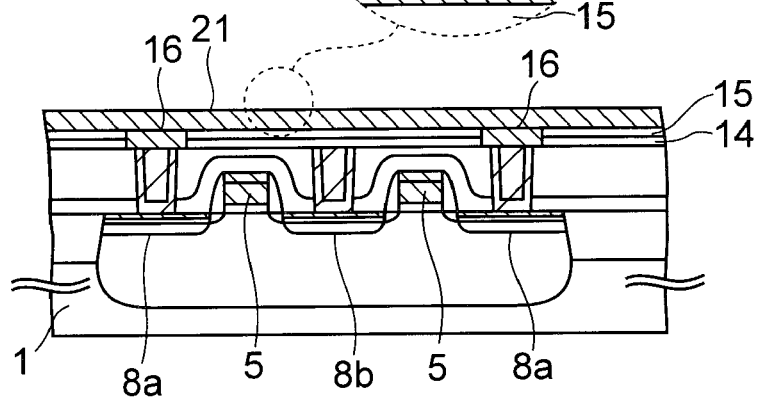

Next, processes for obtaining a cross-sectional structure shown in FIG. 2E will be described.

Firstly, the silicon substrate 1 is placed in an unillustrated MOCVD chamber, and the substrate temperature is stabilized at 270° C. Then, DMAH (dimethyl hydride: $(CH_3)_2AlH$) in the form of liquid in room temperature is passed through a vaporizer, which is held at a high temperature, to be vaporized, and then is supplied into the chamber together with hydrogen. Here, nitrogen is used as a carrier gas of DHAM, the total pressure in the chamber is set to 1.2 Torr, and the partial pressure of DMAH is set to be $3 \times 10^{-3}$ Torr.

By maintaining such a state for a predetermined period of time, an aluminum crystal layer 20 having the orientation in the (111) direction is grown on the upper surface of the first conductive film 21. As long as the aluminum crystal layer 20 functions as an initial growth nucleus of a PZT film to be formed in the following process, a film thickness thereof does not need to be thick. Therefore, it is preferable that the aluminum crystal layer 20 be formed with a thickness of 5 nm or less in a dotted pattern as shown in the figure.

In addition, an aluminum material for forming the aluminum crystal layer 20 is not limited to the above-described DMAH. In place of DMAH, as an aluminum material, diethylaluminum hydride $(C_2H_5)_2AlH$), triisobutylaluminum (Al(i-$C_4H_9)_3$), trimethylamine allan $(AlH_3N(CH_3)_3)$, triethylamine allan $(AlH_3N(C_2H_5)_3)$, dimethylethylamine allan $(AlH_3N(CH_3) 2 (C_2H_5))$, an intermolecular compound of DMAH and trimethylaluminum $(Al(CH_3)_3)$, or a compound of these, can also be used.

Figure 2F:
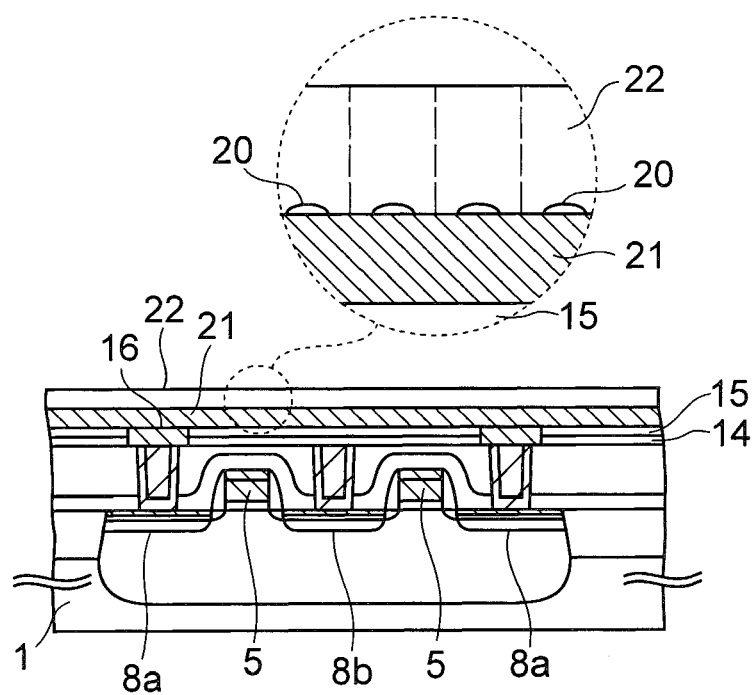

Next, as shown in FIG. 2F, PZT ($Pb(Zr_xTi_{x-1})O_3$) (where $0 \leq x \leq 1$) is formed with a thickness of approximately 120 nm on the aluminum crystal layer 20 by the MOCVD method, and is used as a ferroelectric film 22. Note that in the figure, the dotted lines in the ferroelectric film 22 show interfaces of grains of PZT.

Film-forming conditions for the MOCVD method are not limited. In the present embodiment, $Pb(thd)_2$, $Zr(DMHD)_4$, and Ti(O-iPr) 2 (thd)$_2$ are used for PZT materials, which are supplied to the vaporizer with flow rates of 0.32 ml per minute, 0.2 ml per minute, and 0.2 ml per minute respectively, so that the these materials are vaporized at the temperature of 260° C. After that, the vaporized materials and oxygen of 2500 sccm are mixed, and are sprayed onto the silicon substrate 1, which is maintained at 620° C., under the pressure of 5 Torr for 430 seconds.

At an initial stage of the growth of the ferroelectric film 22, the aluminum crystal layer 20 having the orientation in the (111) direction serves as an initial nucleus to stimulate the growth of the ferroelectric film 22 made of PZT. In addition, PZT crystals in the ferroelectric film 22 are strongly oriented in the (111) direction due to the effect of the aluminum crystal layer 20, and accordingly, the ferroelectric film 22 shows large spontaneous polarization.

Then, at the time when the growth of the ferroelectric film 22 is finished, the aluminum crystal layer 20 is taken into the ferroelectric film 22. Therefore, the ferroelectric film 22 is made of PZT containing aluminum.

Note that the above-described MOCVD method may be carried out by using the MOCVD chamber used for forming the aluminum crystal layer 20, or by using another chamber.

Although the above-described ferroelectric film 22 is formed by the MOCVD method, the ferroelectric film 22 may be formed by the sputtering method or the sol-gel method. In these film forming methods as well, the aluminum crystal layer 20 serves as an initial nucleus of PZT at the time when the ferroelectric film 22 is grown, and the aluminum crystal layer 20 causes PZT of the ferroelectric film 22 to be easily oriented in the (111) direction.

Note that, when the ferroelectric film 22 is formed by the sputtering method, a PZT sputtering target containing at least one of strontium (Sr), calcium (Ca), lanthanum (La), and niobium (Nb) may be used, and a PZT film containing at least one of these elements may be formed as a ferroelectric film 22. Among these elements, strontium, calcium, and lanthanum have an effect to enhance spontaneous polarization of the ferroelectric film 22. On the other hand, niobium has an effect to reduce a leak current of the ferroelectric film 22.

Furthermore, when the ferroelectric film 22 is formed by the sputtering method, rapid thermal annealing is performed for the ferroelectric film 22 in an atmosphere containing oxygen at a substrate temperature of 500° C. to 750° C. so as to crystallize the ferroelectric film 22. At this time, the aluminum crystal layer 20 formed earlier plays a role as an initial nucleus to grow PZT crystals with excellent controllability so that the crystals are oriented in the (111) direction.

Figure 2G:
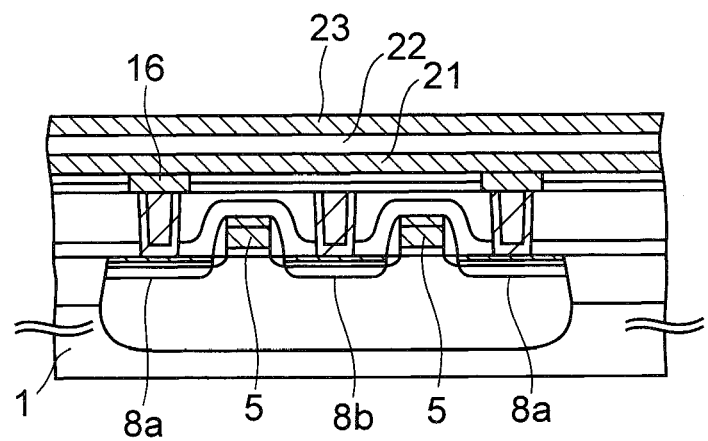

Next, as shown in FIG. 2G, an iridium oxide film is formed as a second conductive film 22 with a thickness of approximately 200 nm on the ferroelectric film 22 by the sputtering method. Here, a platinum film may be formed as the second conductive film 23, in place of the iridium oxide film.

Figure 2H:
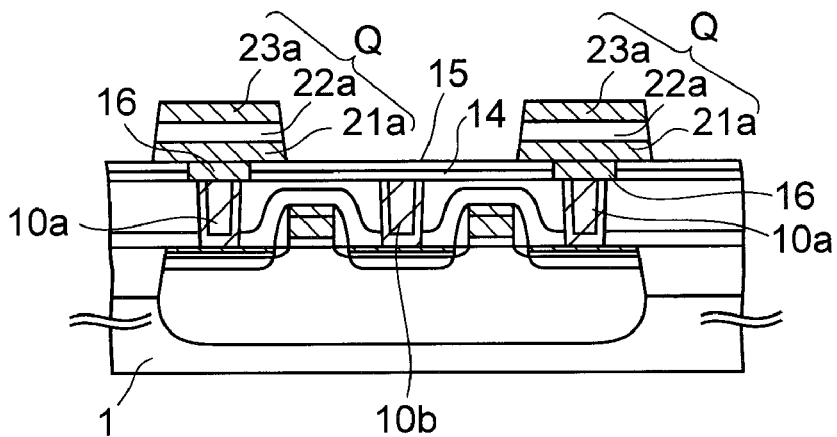

Next, as shown in FIG. 2H, after an unillustrated hard mask is formed on the second conductive film 23, the second conductive film 23, the ferroelectric film 22, and the first conductive film 21 are subjected to the plasma etching in an atmosphere containing a halogen element, so that these films 21-23 are simultaneously etched with the sputtering reaction. Thereby, capacitors Q, each of which is formed by stacking a lower electrode 21a, a capacitor dielectric film 22a, and an upper electrode 23a in this order, are formed. Thereafter, the hard mask is removed.

The lower electrodes 21a of the capacitors Q are each electrically connected to the corresponding first source/drain regions 8a through the corresponding oxygen barrier metal film 16 and the corresponding first conductive plug 10a. In addition, in the etching performed for forming the capacitors Q, the insulating adhesive film 15 made of silicon oxide functions as an etching stopper, and thus the second conductive plug 10b remains protected by the insulating adhesive film 15 and the oxygen preventive insulating film 14.

After that, in order to recover damages received in the capacitor dielectric film 22a due to the above plasma etching, annealing is carried out for the capacitor dielectric film 22a in a furnace containing oxygen under conditions with the substrate temperature of 650° C. and the processing time of 60 minutes. Such annealing is also called recovery annealing.

At the time of this recovery annealing, the second conductive plug 10b constituting the bit line is protected by the oxidation preventive insulating film 14 formed thereon from being oxidized. On the other hand, the first conductive plugs 16 directly under the capacitors Q are protected by the oxygen barrier metal film 16 from being oxidized.

Figure 2I:
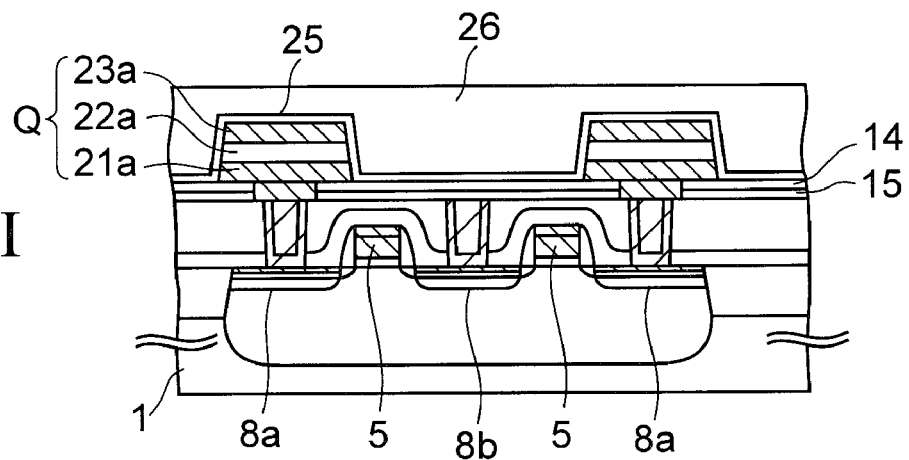

Next, as shown in FIG. 2I, a PZT film as a capacitor protective insulating film 25 is formed with a thickness of approximately 50 nm on the capacitors Q by the sputtering method. This capacitor protective insulating film 25 is used to protect the capacitors Q from a reducing atmosphere such as hydrogen, and may be made of an alumina film instead of the PZT film.

After that, the capacitors Q are annealed in the furnace under a condition with the substrate temperature of 650° C. for approximately 20 minutes.

Subsequently, a silicon oxide film as a second insulating film is formed on the capacitor protective insulating film 25 by the HDPCVD (high density plasma CVD) method using a silane gas as a reaction gas. Then, the upper surface of the second insulating film 26 is polished and planarized by the CMP method, so that the thickness of the second insulating film 26 on the upper electrode 23a becomes approximately 300 nm.

Figure 2J:
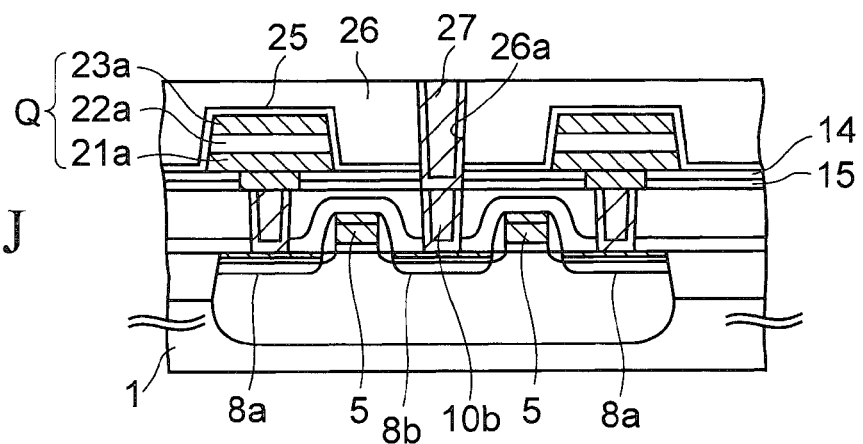

Next, as shown in FIG. 2J, films from the second insulating film 26 through the oxidation preventive insulating film 14 are etched by photolithography, and a first hole 26a is formed in these films. Then, a titanium film and a titanium nitride film are formed in this order on the inner surface of the first hole 26a and the upper surface of the second insulating film 26 by the sputtering method, and the films are used as a glue film. Furthermore, the tungsten film is formed on the glue film by the CVD method, and the first hole 26a is completely embedded by this tungsten film. Thereafter, the excessive tungsten film and glue film on the second insulating film 26 are polished and removed, so that these films are left in the first hole 26a as a third conductive plug 27.

Figure 2K:
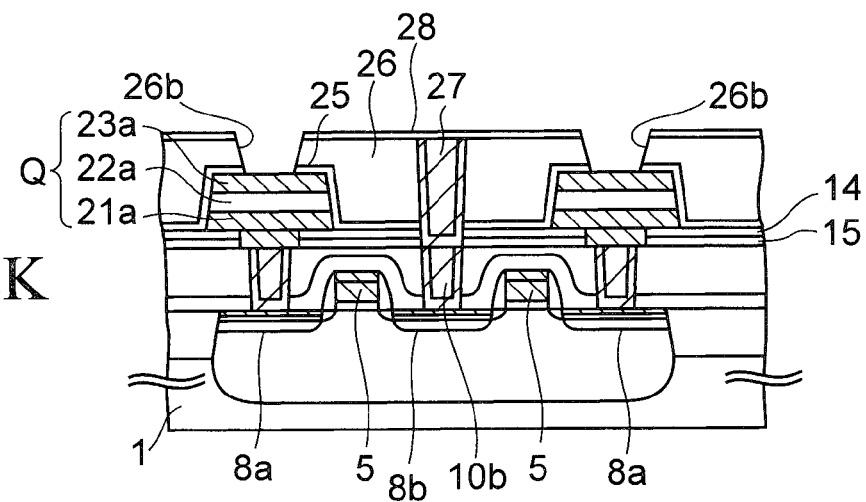

Next, as shown in FIG. 2K, a silicon oxynitride film as an oxidation protective film 28 is formed with a thickness of approximately 100 nm on each of the upper surfaces of the third conductive plug 27 and the second insulating film 26 by the CVD method.

Then, films from the oxidation preventive film 28 through the capacitor protective insulating film 25 are patterned by photolithography to from second holes 26b in the second insulating film 26 on the upper electrodes 23a. The capacitors Q receiving damages by forming the second holes 26b are recovered by annealing. The annealing is carried out, for example, in an atmosphere containing oxygen at the substrate temperature of 550° C. for approximately 60 minutes.

By forming the oxidation preventive film 28 before the annealing as described above, contact defect due to oxidation of the third conductive plug 27 in the annealing can be prevented.

Then, the oxidation preventive film 28 is removed by etch-back after the annealing is finished.

Figure 2L:
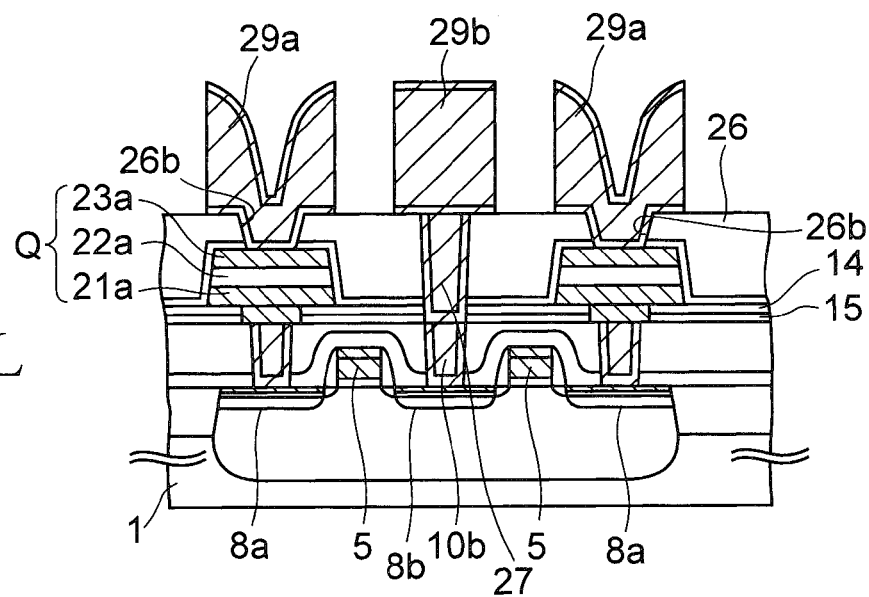

Next, processes for obtaining a cross-sectional structure shown in FIG. 2L will be described.

Firstly, a multi-layered metal film is formed on inner surfaces of the second holes 26b and the upper surface of the second insulating film 26. As the multi-layered metal film, a titanium film with a thickness of approximately 60 nm, a titanium nitride film with a thickness of approximately 30 nm, a copper-containing aluminum film with a thickness of approximately 400 nm, a titanium film with a thickness of approximately 5 nm, and a titanium nitride film with a thickness of 70 nm are formed in this order, for example.

After that, the multi-layered metal film is patterned by photolithography, so that first layer metal wirings 29a, which are electrically connected to the upper electrodes 23a through the second holes 26b, and a conductive pad 29b, which is electrically connected to the third conductive plug 27, are formed.

With this, the basic structure of the semiconductor device according to the present embodiment is completed.

According to the present embodiment described above, as described in FIG. 2F, the aluminum crystal layer 20 is formed on the first conductive film 21. Therefore, the ferroelectric film 22 made of PZT is grown while using the aluminum crystal layer 20 as the initial nucleus, and the (111) orientation of PZT is induced by the aluminum crystal layer 20 having the orientation in the (111) direction.

Thus, unlike the conventional method, there is no need that a titanium film for forming an initial nucleus made of titanium oxide is used for the lower electrodes 21a. In addition, when compared with the conventional method in which an initial nucleus of titanium oxide is formed by utilizing diffusion of titanium, the aluminum crystal layer 20 to be an initial nucleus of PZT is surely formed on the lower electrodes 21a. Accordingly, the orientation of the ferroelectric film 22 can be surely enhanced due to the initial nucleus.

As a result, the capacitor dielectric film 22a with an orientation aligned on the lower electrodes 21a can be formed by the effect of the aluminum crystal layer 20 in the present embodiment even when an iridium film, on which it has conventionally been difficult to form a PZT film with a good orientation, is formed as lower electrodes 21a.

Furthermore, since the ferroelectric film 20 is formed by the MOCVD method, the orientation the ferroelectric film 22 can be enhanced by the aluminum crystal layer as described above, while the crystals of the ferroelectric film 22 are caused to be highly dense to enable miniaturization of the capacitors Q.

Note that when the lattice constant of the initial nucleus comes closer to that of the PZT (111), the ferroelectric film 22 can be oriented in the (111) direction more precisely, and accordingly, the spontaneous polarization of the ferroelectric film 22 becomes larger.

Figure 3:
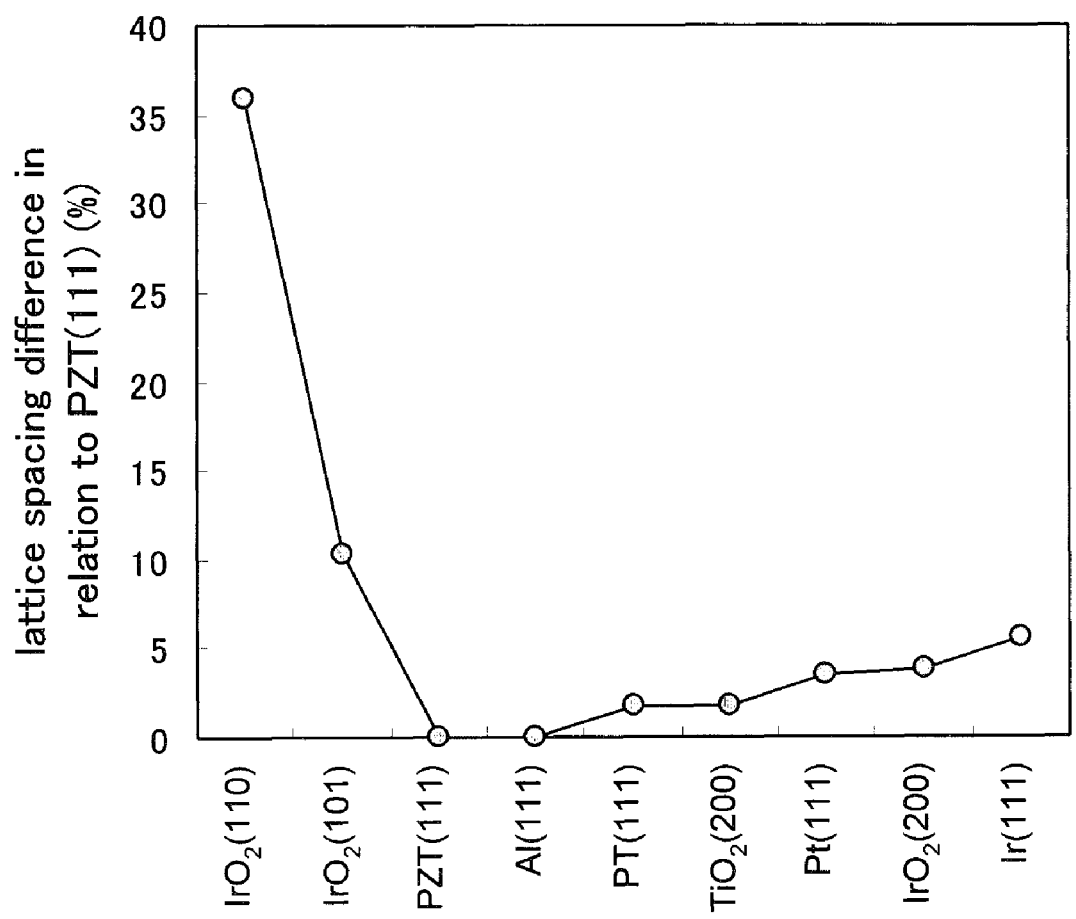
FIG. 3 is a graph obtained by investigating a lattice spacing difference in relation to the PZT (111) for various crystals.

FIG. 3 is a graph obtained by investigating a lattice spacing difference in relation to the PZT (111) for various crystals. Note that the lattice spacing difference is defined as "(lattice spacing of PZT (111)—lattice spacing of crystals of a comparison target)/lattice spacing of PZT (111)."

An Al (111) crystal constituting the aluminum crystal layer 20 is a crystal cubic, and lattice spacing thereof is 2.34. In contrast, a PZT (111) crystal is also a crystal cubic, and lattice spacing thereof is 2.34, which is the same as that of the Al (111) crystal. Hence, the difference in the lattice spacing of Al (111) and PZT (111) is 0 as shown in FIG. 8. Thus, the ferroelectric film 22 made of PZT is easily lattice-matched with the aluminum crystal layer 20, so that the ferroelectric film 22 having reduced orientation disorder due to lattice mismatch can be formed on the aluminum crystal layer 20.

In contrast, Pt (111) conventionally used as a lower electrode for inducing the (111) orientation of PZT has lattice spacing of 2.26. Thus, Pt (111) is difficult to be lattice-matched with the PZT (111) having the lattice spacing of 2.34. In addition, $PbTiO_3$ (111) and $TiO_2$ (200), each of which is conventionally formed as an initial nucleus of PZT, have both lattice spacing of 2.30. Thus, $PbTiO_3$ (111) and $TiO_2$ (200) are also difficult to be lattice-matched with the PZT (111).

In this manner, the aluminum crystal layer 20 made of Al (111) is lattice-matched with the ferroelectric film 20 very easily, when compared with other crystals. As a result, it becomes possible that defects due to lattice mismatch are hardly caused in the ferroelectric film 22.

The aluminum crystal layer 20 is excellent in effects of increasing the orientation of the ferroelectric film 22 made of PZT as descried above. However, if the thickness of the aluminum crystal layer 20 is too thick, aluminum taken into the ferroelectric film 22 becomes $Al_2O_3$. As a result, ferroelectric characteristics of the ferroelectric film 22, such as residual polarization charges, are deteriorated. In order to avoid such inconvenience, it is preferable that the film thickness of the aluminum crystal layer 20 be set to as thin as possible, for example, 5 nm or less. If the aluminum crystal layer 20 is formed with a thickness thicker than 5 nm, the ferroelectric characteristics of the ferroelectric film 22 are deteriorated from the reason described above, and the ferroelectric film 22 does not show the ferroelectric characteristics.

(2) Second Embodiment

FIGS. 4A to 4J are cross-sectional views showing processes of manufacturing a semiconductor device according to a second embodiment. Note that components described in the first embodiment are provided with the same reference numerals as those in the first embodiment, and the description thereof will be omitted.

Figure 4A:
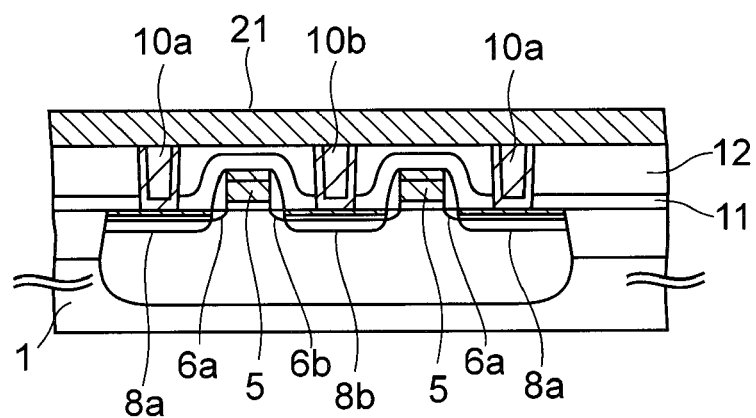
FIGS. 4A to 4J are cross-sectional views showing processes of manufacturing a semiconductor device according to a second embodiment.

In order to manufacture a semiconductor device according to the present embodiment, the process described in FIG. 2A in the first embodiment is firstly carried out. Thereafter, as shown in FIG. 4A, an iridium film as a first conductive film 21 is formed with a thickness of approximately 200 nm on each of the upper surfaces of first and second conductive plugs 10a and 10b as well as the upper surface of a first insulating film 12, by a DC sputtering method.

Figure 4B:
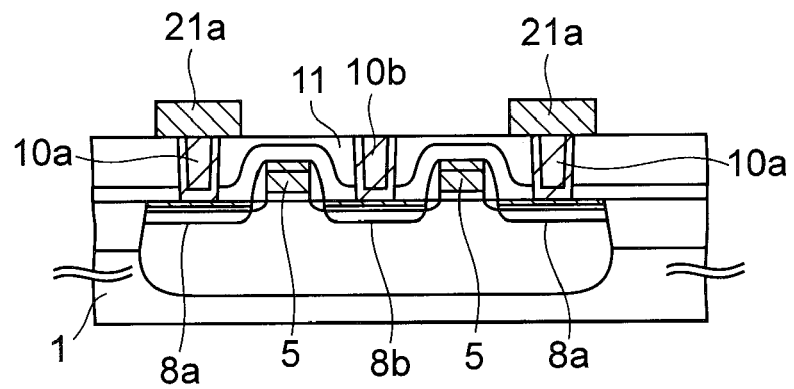

Next, as shown in FIG. 4B, this first conductive film 21 is patterned by photolithography to form a lower electrode 21a in an island shape on each of the first conductive plugs 10a.

Figure 4C:
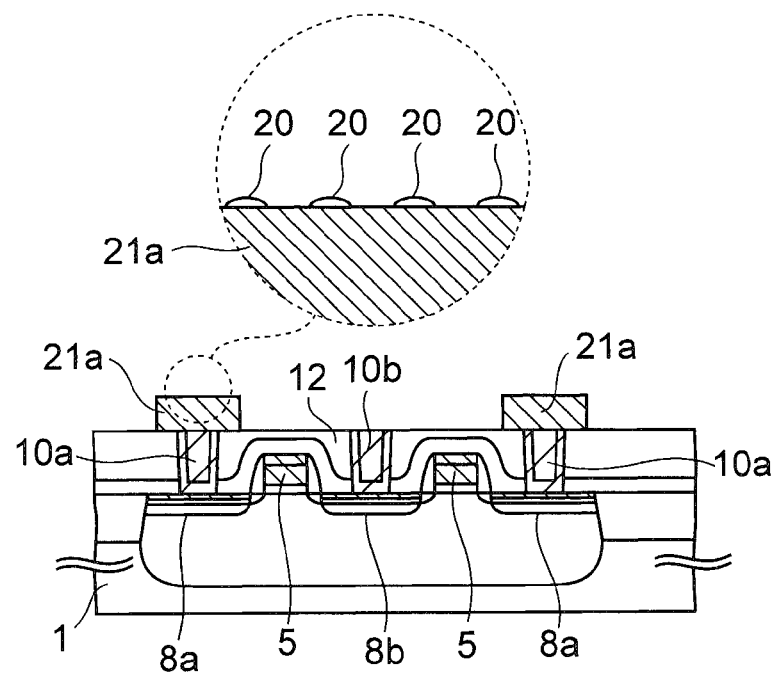

Subsequently, as shown in FIG. 4C, an aluminum crystal layer 20 in a dotted pattern is formed with a thickness of 5 nm or less on side surfaces and the upper surfaces of lower electrodes 21a and the upper surface of a first insulating film 11, by the MOCVD method employing the same film-forming conditions as those of the first embodiment.

Figure 4D:
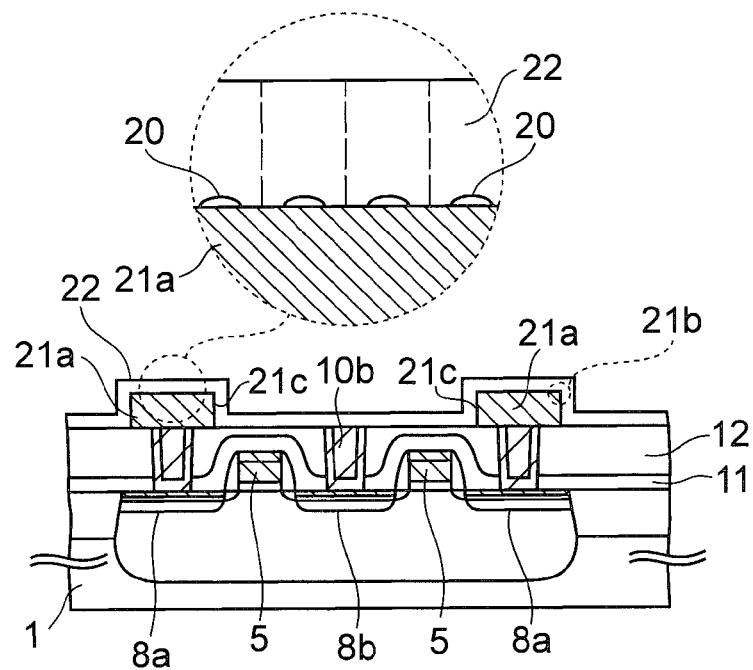

Thereafter, as shown in FIG. 4D, a PZT film is formed with a thickness of approximately 120 nm on the aluminum crystal layer 20 and the first insulating film 12 by the MOCVD method. The PZT film thus formed is used as a ferroelectric film 22. Film-forming conditions of the ferroelectric film 22 are same as those of the first embodiment, and thus the description thereof will be omitted.

Figure 4E:
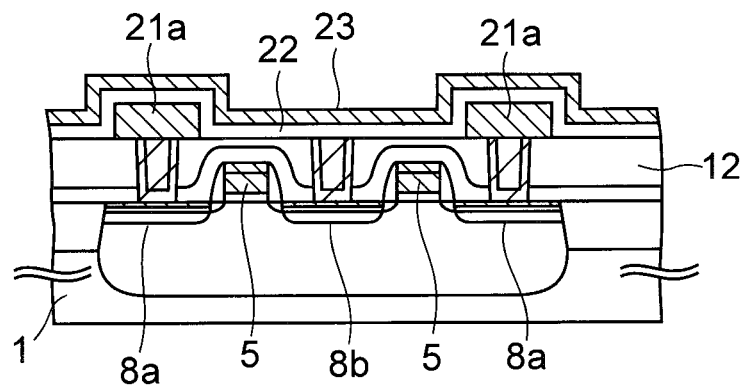

Next, as shown in FIG. 4E, an iridium oxide film is formed on the ferroelectric film 22 by the sputtering method as a second conductive film 23. Here, a thickness of the second conductive film 23 is not particularly limited. In the present embodiment, the thickness is set to approximately 200 nm.

Figure 4F:
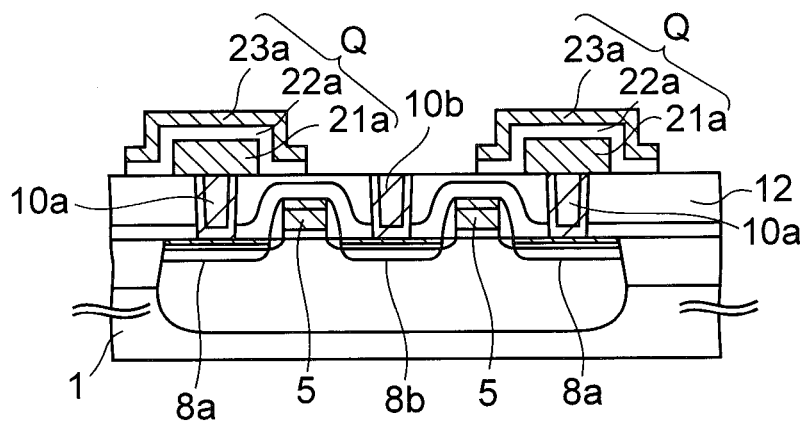

Subsequently, as shown in FIG. 4F, the second conductive film 23 and the ferroelectric film 22 are simultaneously patterned by photolithography. Thus, the ferroelectric film 22 is left on the side surfaces and the upper surfaces of the lower electrodes 21a as capacitor dielectric films 22a. Furthermore, the second conductive film 23 is left over and beside the lower electrodes 21a as upper electrodes 23a.

With this, capacitors Q, each of which is formed by stacking the lower electrode 21a, the capacitor dielectric film 22a, and the upper electrode 23a in this order on the first conductive plug 10a, are formed.

Figure 4G:
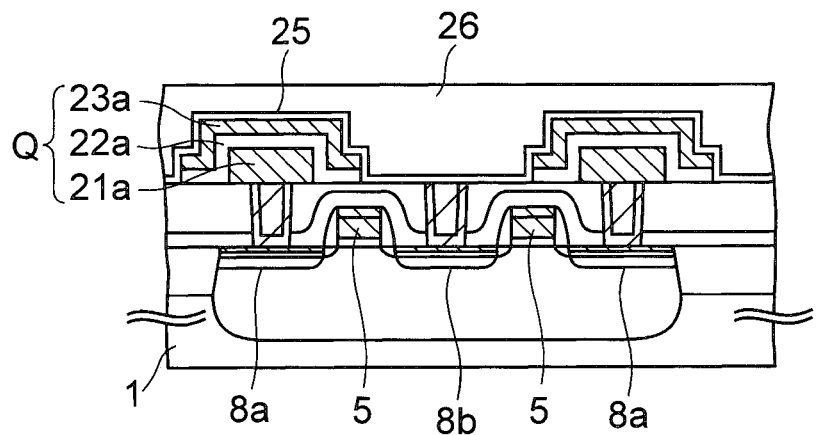

Next, as shown in FIG. 4G, in order to protect the capacitors Q from a reducing atmosphere such as hydrogen, a PZT film as a capacitor protective insulating film 25 is formed with a thickness of approximately 50 nm on each of the capacitors Q, by the sputtering method.

Subsequently, a silicon oxide film is formed on the capacitor protective insulating film 25 by the HDPCVD method using a silane gas as a reaction gas, and the silicon oxide film is used a second insulating film 26. Thereafter, the upper surface of the second insulating film 26 is polished and planarized by the CMP method. Thus, the thickness of the second insulating film 26 becomes approximately 300 nm on the upper electrode 23a.

Figure 4H:
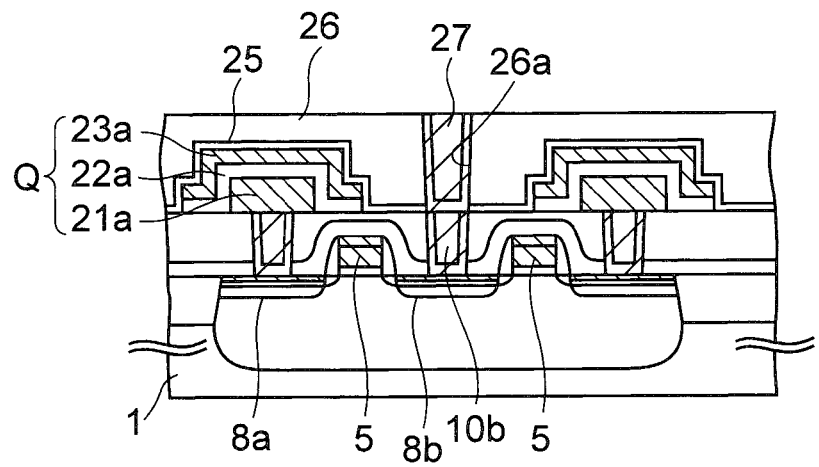

Next, as shown in FIG. 4H, the second insulating film 26 and the capacitor protective insulating film 25 are patterned by photolithography, and a first hole 26a is formed in these films on the second conductive plug 10b. Thereafter, by carrying out a process similar to that described in FIG. 2J of the first embodiment, a third conductive plug 27 is formed in the first hole 26a. Note that the third conductive plug 27 is constructed by forming the glue film, such as a titanium nitride film, and tungsten film in this order.

Figure 4I:
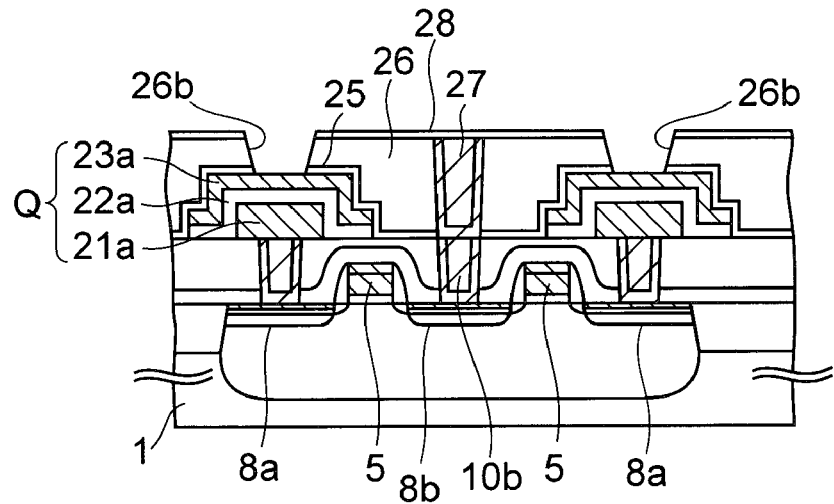

Next, as shown in FIG. 4I, a silicon oxynitride film as an oxidation preventive film 28 is formed with a thickness of 100 nm on each of the upper surfaces of the third conductive plug 27 and the second insulating film 26 by the CVD method.

Then, films from the oxidation preventive film 28 through the capacitor protective insulating film 25 are patterned by photolithography to form a second hole 26b in the second insulating film 26 on the upper electrode 23a.

Thereafter, in order to recover damages received in the capacitors Q when the second hole 26a is formed, annealing is carried out for the capacitors Q in an atmosphere containing oxygen at a substrate temperature of 550° C. for approximately 60 minutes.

During this annealing, the third conductive plug 27 is protected from the atmosphere containing oxygen by the oxidation preventive film 28. Thus, contact defect due to oxidation of the third conductive plug 27 can be prevented.

Thereafter, the oxidation preventive film 28 is removed by etch-back.

Figure 4J:
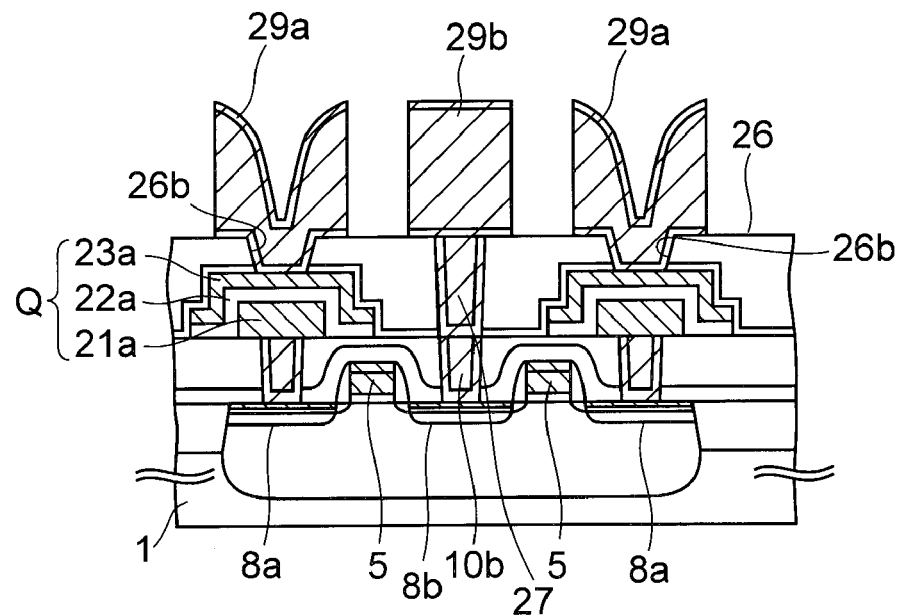

Next, as shown in FIG. 4J, a multi-layered metal film is formed in the second hole 26b and on the second insulating film 26 by the sputtering method. This multi-layered metal film is patterned to form first layer metal wirings 29a and a conductive pad 29b. Similar to the first embodiment, the multi-layered metal film is formed by stacking a titanium film with a thickness of approximately 60 nm, a titanium nitride film with a thickness of approximately 30 nm, a copper-containing aluminum film with a thickness of approximately 400 nm, a titanium film with a thickness of approximately 5 nm, and a titanium nitride film with a thickness of approximately 70 nm in this order.

With this, the basic structure of the semiconductor device according to the present embodiment is completed.

In the capacitors Q of this semiconductor device, a capacitor dielectric film 22a is formed not only on the upper surface of the lower electrode 21a but also on side surfaces of the lower electrode 21a, as shown in FIG. 4J. As a result, when compared with the first embodiment, a facing area of the lower electrode 21a and the capacitor dielectric film 22a increases. Thus, the amount of residual polarization charges in one capacitor Q can be increased. Such a structure of the capacitor Q will be hereinafter referred to as a three dimensional capacitor structure.

In the three dimensional capacitor structure, as shown in FIG. 4D, it is necessary that the ferroelectric film 22 is formed on side surfaces 21c of each of the lower electrodes 21a. If step coverage of this ferroelectric film 22 is poor, the thickness of the ferroelectric film 22 becomes small at a corner 21b of the lower electrode 21a, and leak current flows at the corner 21b from the lower electrode 21a to the upper electrode 23a (see, FIG. 4J).

Hence, in the three dimensional capacitor structure, the ferroelectric film 22 is required to have preferable step coverage.

In view of such a problem, the ferroelectric film 22 is formed by the MOCVD method with which a film excellent in step coverage can be formed in the present embodiment. Thus, the thickness of the ferroelectric film 22 is substantially same on the side surfaces and the upper surface of the lower electrode 21a. Consequently, the leak current between the upper electrode 23a and the lower electrode 21a described above can be suppressed, and the capacitor Q with high quality can be formed.

In addition, as shown in FIG. 4D, the aluminum crystal layer 20 serving as a growth nucleus of the PZT is formed on the lower electrode 21a. Thus, as described in the first embodiment, PZT in the ferroelectric film 22 can be strongly oriented in the (111) direction.

(3) Third Embodiment

In the above-described first and second embodiments, a capacitor dielectric film 22a is made of a single layer of a PZT film. However, the present embodiment is not limited to this.

Figure 5:
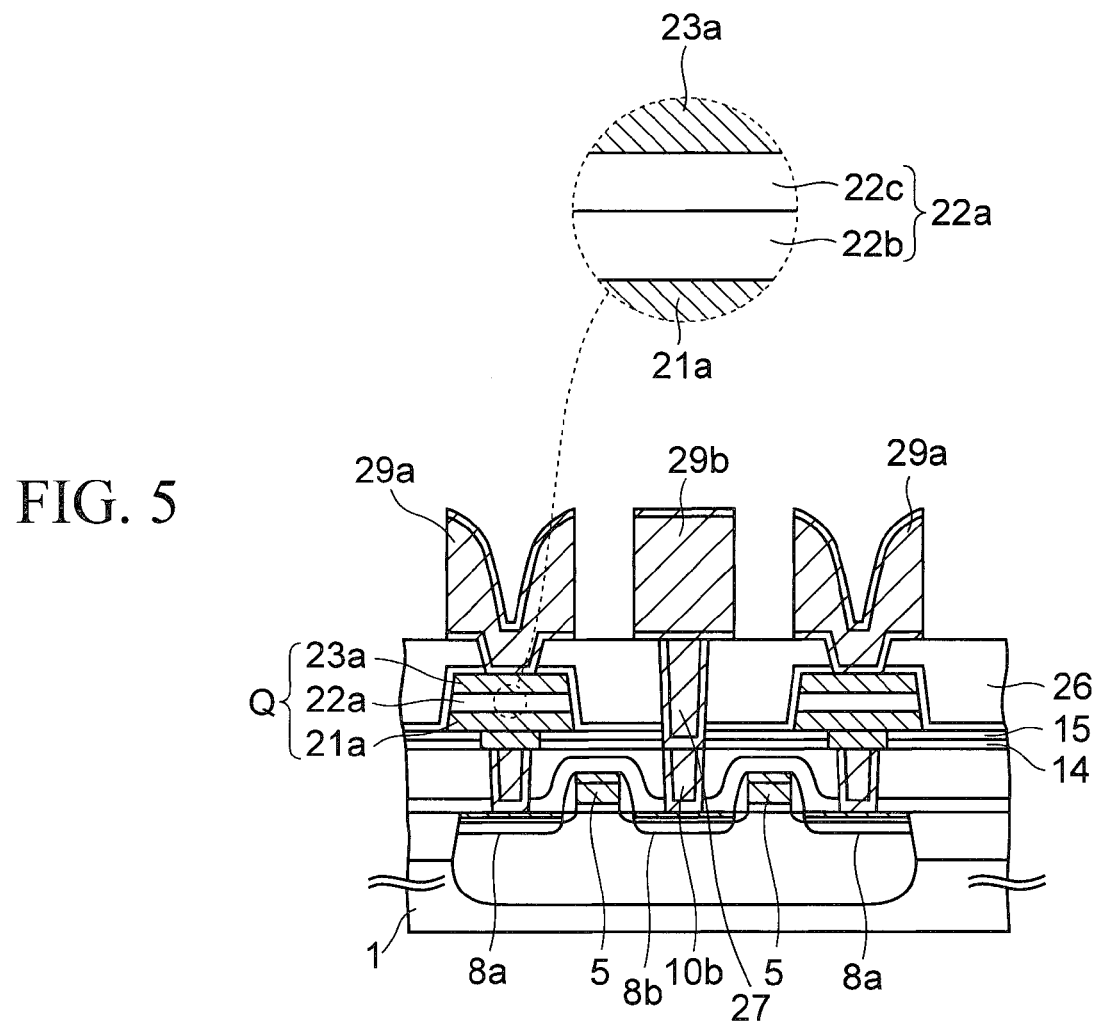
FIG. 5 is a cross-sectional view of the semiconductor device according to the first embodiment with a structure that two layers of capacitor dielectric films are formed.

For example, as shown in FIG. 5, a stacked film of a first ferroelectric film 22b made of PZT and a second ferroelectric film 22c made of PZT into which at least one of strontium, calcium, lanthanum, and niobium is doped may be formed as the capacitor dielectric film 22a in the first embodiment.

Figure 6:
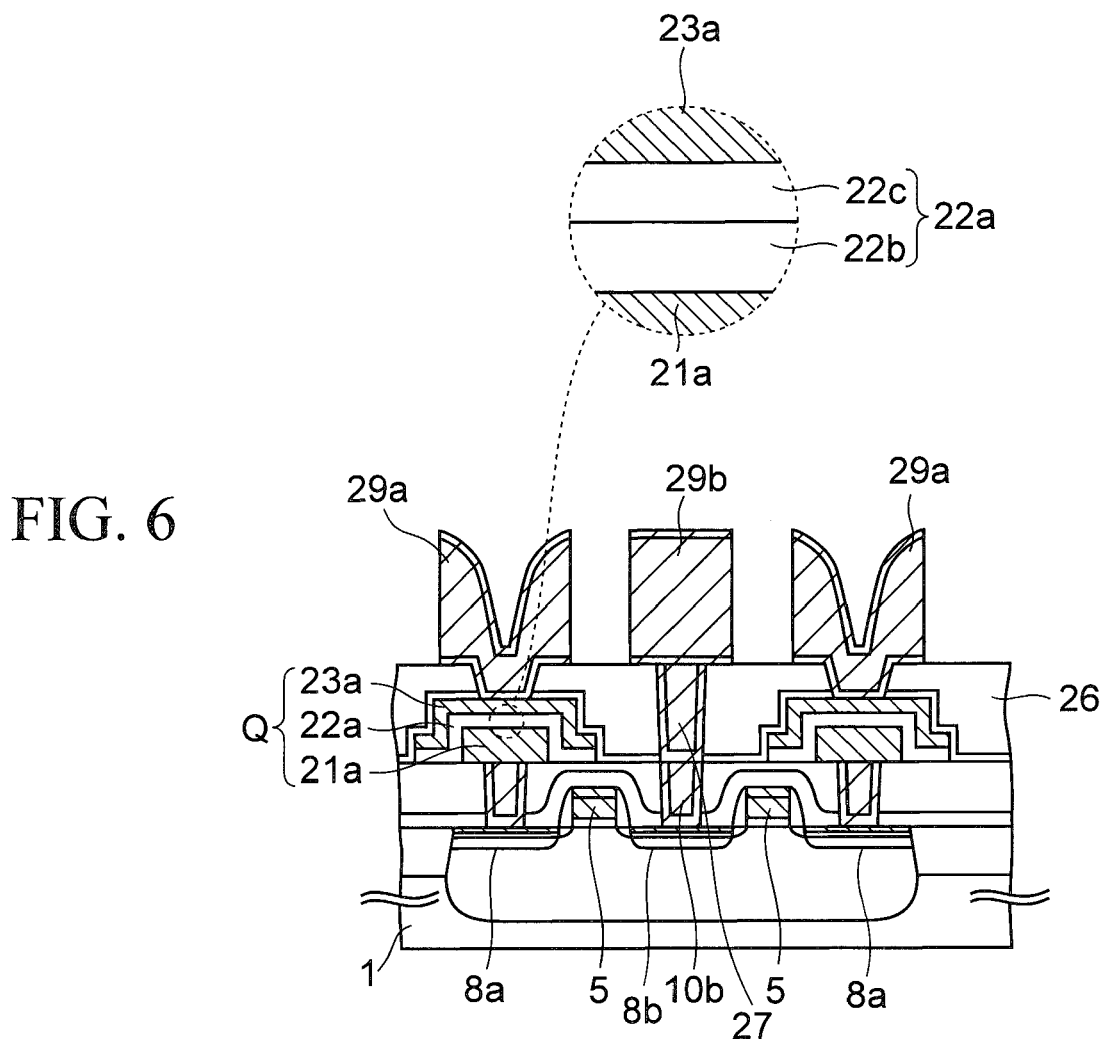
FIG. 6 is a cross-sectional view of the semiconductor device according to the second embodiment with a structure that two layers of capacitor dielectric films are formed.

As shown in FIG. 6, such a stacked film of the first and second ferroelectric films 22b and 22c may be formed also as the capacitor dielectric film 22a in the second embodiment.

Even when the capacitor dielectric film 22a with a stacked structure shown in FIGS. 5 and 6 is employed, the orientation of PZT (111) is induced in each of the films 22b and 22c due to the effect of the aluminum crystal layer 20, as is described in the first and second embodiments, so that the capacitor dielectric film 22a can be extremely well oriented.

In addition, in the above-described first and second embodiments, the descriptions have been given to a stack-type FeRAM in which a lower electrode 21a is formed over a first conductive plug 10a, but the present embodiments may be applied also to a planar-type FeRAM.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device, comprising:
    forming an insulating film over a semiconductor substrate;
    forming a first conductive film over the insulating film;
    forming an aluminum crystal layer on the first conductive film;
    forming a ferroelectric film containing $Pb(Zr_xTi_{1-x})O_3$ (where $0 \leq x \leq 1$) on the aluminum crystal layer;
    forming a second conductive film on the ferroelectric film; and
    patterning the first conductive film, the ferroelectric film, and the second conductive film to form a capacitor including a lower electrode, a capacitor dielectric film, an upper electrode which are sequentially stacked, wherein
    the aluminum crystal layer is formed in a dotted pattern.

2. The method for manufacturing a semiconductor device according to claim 1, wherein the orientation of the aluminum crystal layer is in a (111) direction.

3. The method for manufacturing a semiconductor device according to claim 1, wherein the aluminum crystal layer is formed with a thickness of 5 nm or less.

4. The method for manufacturing a semiconductor device according to claim 1, wherein the ferroelectric film is formed by an MOCVD (metal organic CVD) method.

5. The method for manufacturing a semiconductor device according to claim 1, wherein an iridium film is formed as the first conductive film.

6. The method for manufacturing a semiconductor device according to claim 1, wherein a film in which at least one of strontium, calcium, lanthanum, and niobium is contained in the $Pb(Zr_xTi_{1-x})O_3$ is formed as the ferroelectric film.

7. The method for manufacturing a semiconductor device according to claim 1, wherein a stacked film of a first ferroelectric film made of $Pb(Zr_xTi_{1-x})O_3$ and a second ferroelectric film in which at least one of strontium, calcium, lanthanum, and niobium is contained in $Pb(Zr_xTi_{1-x})O_3$ is formed as the ferroelectric film.

8. The method of manufacturing a semiconductor device according to claim 1, wherein the first conductive film is formed by a DC sputtering method.

9. A method for manufacturing a semiconductor device, comprising:

forming an insulating film over a semiconductor substrate;

forming a first conductive film over the insulating film;

patterning the first conductive film to form a lower electrode;

forming an aluminum crystal layer on a side surface and an upper surface of the lower electrode;

forming a ferroelectric film containing $Pb(Zr_xTi_{1-x})O_3$ (where $0 \leqq x \leqq 1$) on the aluminum crystal layer and the insulating film;

forming a second conductive film on the ferroelectric film;

patterning the ferroelectric film to leave the ferroelectric film as a capacitor dielectric film on the side surface and the upper surface of the lower electrode; and patterning the second conductive film to leave the second conductive film, as an upper electrode, over and beside a side of the lower electrode, and forming a capacitor with the upper electrode, the capacitor dielectric film, and the lower electrode.

10. The method for manufacturing a semiconductor device according to claim 9, wherein an orientation of the aluminum crystal layer is in a (111) direction.

11. A semiconductor device comprising:

a semiconductor substrate;

an insulating film formed over the semiconductor substrate; and a capacitor, which is formed on the insulating film, and which is formed by sequentially stacking a lower electrode, a capacitor dielectric film containing $Pb(Zr_xTi_{1-x})O_3$ (where $0 \leqq x \leqq 1$) and aluminum, and an upper electrode.

12. The semiconductor device according to claim 11, wherein the lower electrode is made of iridium.

* * * * *